US011114136B2

(12) United States Patent
McKinney et al.

(10) Patent No.: US 11,114,136 B2
(45) Date of Patent: Sep. 7, 2021

(54) CIRCUIT, SYSTEM, AND METHOD FOR READING MEMORY-BASED DIGITAL IDENTIFICATION DEVICES IN PARALLEL

(71) Applicant: Marcon International Inc, Harrisburg, NC (US)

(72) Inventors: Richard McKinney, Harrisburg, NC (US); Ric Stone, Harrisburg, NC (US)

(*) Notice: Subject to any disclaimer, the term of this patent is extended or adjusted under 35 U.S.C. 154(b) by 107 days.

(21) Appl. No.: 16/107,500

(22) Filed: Aug. 21, 2018

(65) Prior Publication Data
US 2020/0066313 A1 Feb. 27, 2020

(51) Int. Cl.
*G11C 7/10* (2006.01)
*G06K 17/00* (2006.01)
*G06F 13/16* (2006.01)
*G06F 13/42* (2006.01)
*H04Q 11/04* (2006.01)

(52) U.S. Cl.
CPC ........ *G11C 7/1018* (2013.01); *G06F 13/1657* (2013.01); *G06F 13/4291* (2013.01); *G06K 17/0022* (2013.01); *H04Q 11/0421* (2013.01); *G06F 13/1684* (2013.01); *H04Q 2213/13106* (2013.01)

(58) Field of Classification Search
None
See application file for complete search history.

(56) References Cited

U.S. PATENT DOCUMENTS

| | | | | |
|---|---|---|---|---|
| 4,737,950 A * | 4/1988 | Fechalos | ............ | H04Q 11/0407 370/434 |
| 5,005,151 A * | 4/1991 | Kurkowski | ........... | G06F 13/372 341/100 |
| 5,307,349 A * | 4/1994 | Shloss | .................. | H04B 7/2643 370/442 |
| 5,555,382 A * | 9/1996 | Thaller | ............... | G06F 12/0831 710/100 |
| 5,615,225 A * | 3/1997 | Foster | ..................... | H04M 3/26 370/241 |
| 5,732,242 A * | 3/1998 | Mowry | ................... | G06F 9/383 711/122 |
| 5,752,260 A * | 5/1998 | Liu | ..................... | G06F 12/0851 711/129 |
| 5,978,307 A * | 11/1999 | Proebsting | ........... | G11C 7/1006 365/189.04 |
| 6,002,344 A * | 12/1999 | Bandy | .................. | G06K 7/0008 340/10.2 |

(Continued)

*Primary Examiner* — Curtis J King

(57) ABSTRACT

A system and method for simultaneously reading a plurality of readable memory-based digital identification devices, including: a host microcontroller; and a plurality of readable memory-based digital identification devices electrically coupled to the host microcontroller in a parallel configuration; wherein the host microcontroller is configured to assert a read prompt to each of the plurality of the plurality of readable memory-based digital identification devices during a same clock cycle; wherein each of the plurality of readable memory-based digital identification devices is configured to send a response to the host microcontroller in a same clock cycle; and wherein the host microcontroller is configured to capture identification data from each of the plurality of readable memory-based digital identification devices in a same clock cycle.

12 Claims, 7 Drawing Sheets

(56) References Cited

U.S. PATENT DOCUMENTS

| | | | | |
|---|---|---|---|---|
| 6,109,971 | A * | 8/2000 | Vadlakonda | H01R 13/6597 |
| | | | | 439/607.01 |
| 6,112,295 | A * | 8/2000 | Bhamidipati | G06F 5/10 |
| | | | | 711/110 |
| 6,151,558 | A * | 11/2000 | Conant | G01F 1/662 |
| | | | | 702/45 |
| 6,189,140 | B1 * | 2/2001 | Madduri | G06F 11/348 |
| | | | | 712/227 |
| 6,321,297 | B1 * | 11/2001 | Shamanna | G06F 12/0864 |
| | | | | 710/52 |
| 6,373,389 | B1 * | 4/2002 | Przygoda, Jr. | G06K 17/00 |
| | | | | 340/572.4 |
| 6,693,538 | B2 | 2/2004 | Maloney | |
| 6,707,380 | B2 | 3/2004 | Maloney | |
| 6,714,956 | B1 * | 3/2004 | Liu | H03H 21/0043 |
| | | | | 708/322 |
| 6,952,157 | B1 * | 10/2005 | Stewart | G06K 7/0008 |
| | | | | 235/375 |
| 7,654,853 | B2 | 2/2010 | Smilie | |
| 7,844,505 | B1 * | 11/2010 | Arneson | G06Q 10/087 |
| | | | | 340/10.2 |
| 7,852,214 | B2 | 12/2010 | Smilie | |
| 8,719,925 | B1 * | 5/2014 | Berg | G06F 21/567 |
| | | | | 726/22 |
| 9,916,253 | B2 * | 3/2018 | Avudaiyappan | G06F 12/0895 |
| 2003/0005238 | A1 * | 1/2003 | Pawlowski | G06F 12/0855 |
| | | | | 711/146 |
| 2003/0214389 | A1 * | 11/2003 | Arneson | G06Q 10/08 |
| | | | | 340/10.1 |
| 2004/0111338 | A1 * | 6/2004 | Bandy | G06K 7/0008 |
| | | | | 705/28 |
| 2004/0123076 | A1 * | 6/2004 | Sheaffer | G06F 9/3875 |
| | | | | 712/210 |
| 2004/0153913 | A1 * | 8/2004 | Fishman | H04B 17/15 |
| | | | | 714/724 |
| 2004/0210727 | A1 * | 10/2004 | Stefan | G11C 15/00 |
| | | | | 711/154 |
| 2005/0111443 | A1 | 5/2005 | Herbert | |
| 2005/0177707 | A1 * | 8/2005 | Banerjee | G06F 9/30167 |
| | | | | 712/226 |
| 2005/0280506 | A1 * | 12/2005 | Lobanov | G06K 7/0008 |
| | | | | 340/10.1 |
| 2005/0280543 | A1 | 12/2005 | Herbert | |
| 2006/0069873 | A1 * | 3/2006 | Carlson | G06F 12/0855 |
| | | | | 711/125 |
| 2008/0100443 | A1 * | 5/2008 | Grunwald | H04L 63/0492 |
| | | | | 340/572.1 |
| 2008/0150674 | A1 * | 6/2008 | Park | H04W 28/06 |
| | | | | 340/3.41 |
| 2009/0040021 | A1 * | 2/2009 | Seo | G06K 7/10049 |
| | | | | 340/10.1 |
| 2009/0091426 | A1 * | 4/2009 | Barnes | G06Q 20/4014 |
| | | | | 340/10.1 |
| 2009/0134975 | A1 * | 5/2009 | Eom | G06K 7/0008 |
| | | | | 340/10.2 |
| 2009/0135782 | A1 * | 5/2009 | Litwin | H04B 1/70735 |
| | | | | 370/331 |
| 2010/0039237 | A1 * | 2/2010 | Radhakrishnan | G06K 7/10029 |
| | | | | 340/10.4 |
| 2010/0214071 | A1 * | 8/2010 | Nagai | G06K 7/0008 |
| | | | | 340/10.1 |
| 2010/0235674 | A1 * | 9/2010 | Song | G06F 7/32 |
| | | | | 713/600 |
| 2011/0115608 | A1 * | 5/2011 | Nagai | G06K 7/10089 |
| | | | | 340/10.1 |
| 2011/0155806 | A1 * | 6/2011 | Franz | G06K 7/0166 |
| | | | | 235/435 |
| 2012/0135681 | A1 * | 5/2012 | Adams | H04B 5/0025 |
| | | | | 455/41.1 |
| 2013/0048711 | A1 * | 2/2013 | Burns | G06K 5/02 |
| | | | | 235/375 |
| 2015/0363318 | A1 * | 12/2015 | Redford | G06F 12/0864 |
| | | | | 711/128 |
| 2016/0239422 | A1 * | 8/2016 | Talukdar | G06F 12/0846 |
| 2016/0299700 | A1 * | 10/2016 | Day | G06F 12/0842 |
| 2017/0068591 | A1 * | 3/2017 | Tate | G11C 7/14 |
| 2017/0090791 | A1 * | 3/2017 | Grubisic | G06F 3/0665 |
| 2019/0035183 | A1 * | 1/2019 | Bennett | G06F 3/044 |
| 2019/0043583 | A1 * | 2/2019 | Majumder | G06T 1/60 |
| 2019/0116164 | A1 * | 4/2019 | Boivie | G06F 21/6245 |
| 2019/0370196 | A1 * | 12/2019 | Moto | G06F 13/10 |

\* cited by examiner

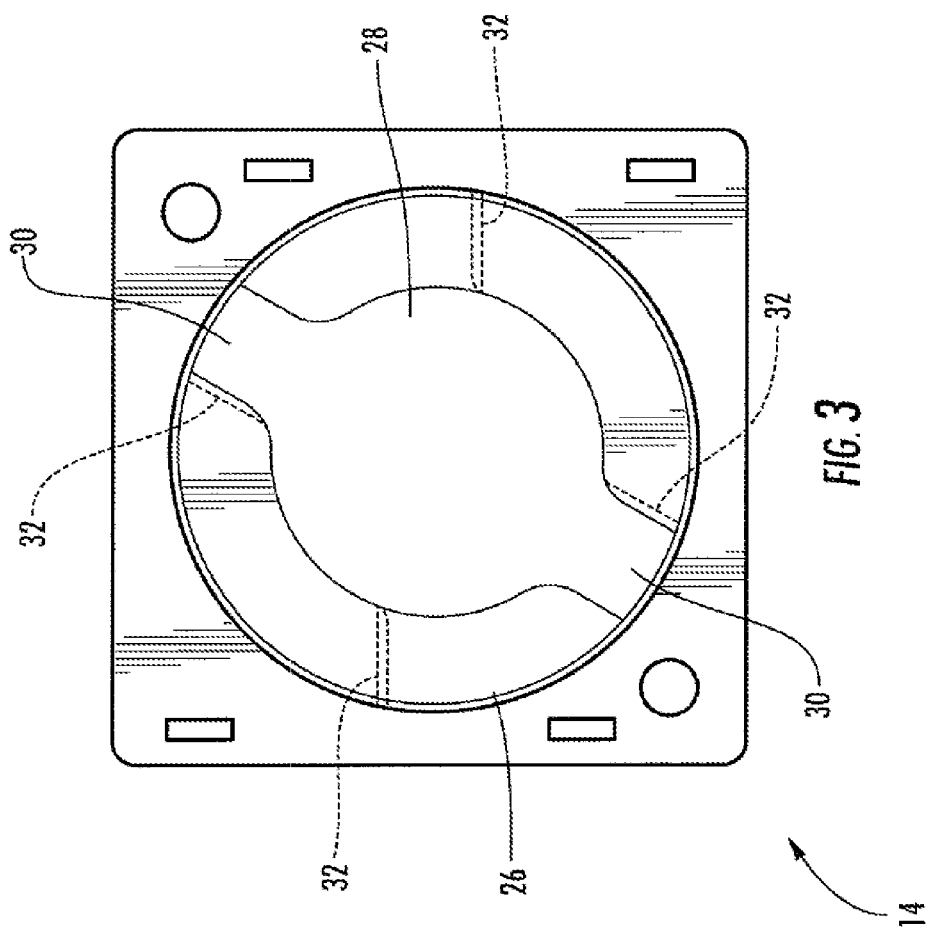

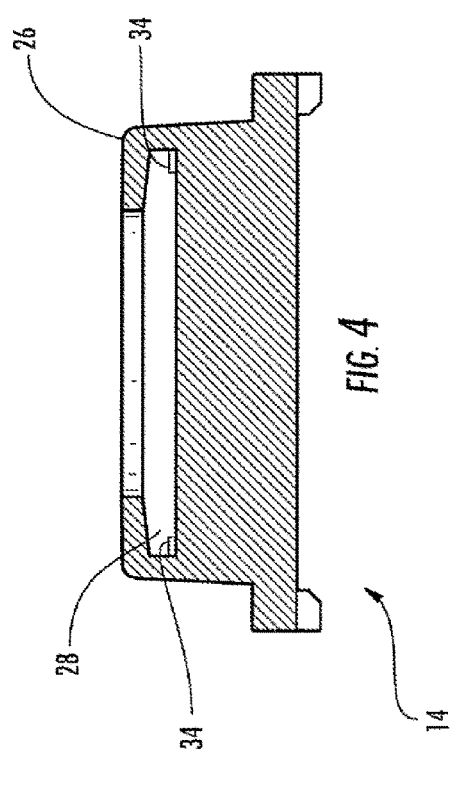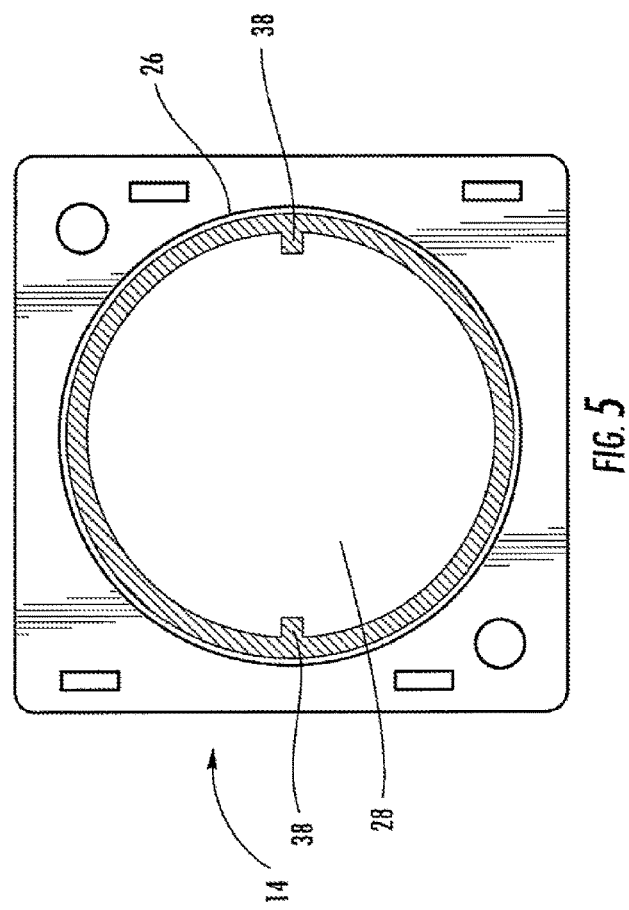

CIRCUIT, SYSTEM, AND METHOD FOR READING MEMORY-BASED DIGITAL IDENTIFICATION DEVICES IN PARALLEL

FIELD OF THE INVENTION

The present invention relates generally to a reader board assembly circuit, system, and method for identifying a digital device, and more particularly to a reader board assembly circuit, system, and method that enables a host microcontroller or microprocessor to identify a digital device among multiple digital devices on a serial data bus, and designating this location via a light emitting source, for example. The reader board assembly circuit, system, and method of the present invention find applicability to key control and management systems, as well as to a plurality of other systems. Further, the present invention provides a circuit, system, and method for reading memory-based digital identification devices in parallel, such that cumulative read time is significantly reduced.

BACKGROUND OF THE INVENTION

There are a number of conventional circuit designs for the detection, identification, and/or activation of digital devices that have unique digital registration numbers. One such digital device is an IButton® microprocessor (Dallas Semiconductor), which may contain a memory, a real-time clock, a transaction counter, a temperature sensor, and/or the like. The microprocessor is typically connected via a one-wire interface that is a serial data bus. In order to utilize, troubleshoot, and repair these circuit designs, the prior art discloses using a switching network to identify the location of a specific digital device.

What is still needed in the art, however, is a system that consists of discreet modular units that may be added or subtracted as needed, as well as a means for querying a circuit to detect, identify, and/or activate a specific module.

U.S. Pat. No. 6,693,538 (issued to Maloney on Feb. 17, 2004) discloses one specific application of the digital devices described above. Object carriers are provided for use with an object tracking and control system of a type having a storage receptacle with a tray provided with an array of slots for receiving identification (ID) tags bearing touch memory devices. A computer-based controller is provided for detecting the absence or presence and identity of ID tags disposed in the slots. The carrier includes a container with an openable panel for placing objects in and removing objects from the carrier. A thin plastic tongue projects from the carrier and bears a touch memory device. Carriers bearing objects to be tracked are placed in the storage receptacle with their tongues extending into the slots of the receptacle. The controller thus detects and logs the removal and replacement of the carrier in the storage receptacle. In one embodiment, the opening and closing of the carrier when it is not stored in the receptacle is detected and logged for tracking access to the carrier in more detail. In general, each of the carriers includes an internal addressable switch having one or more input/output (I/O) ports; an on-board sensor, such as a loop-detector sensor for detecting when an object is removed from the carrier, a reed switch for detecting the opening of the carrier, or another type of sensor depending on the intended use of the system; and a light-emitting diode (LED) attached to the carrier.

What is still needed in the art, however, is a system that is simpler, omitting the internal addressable switch and the one or more I/O ports, and associating the LEDs with the storage receptacle, as opposed to the carriers.

Further, most conventional schemes for reading memory-based identification devices do so in a serial manner. For example, U.S. Pat. No. 6,707,380 (issued to Maloney on Mar. 16, 2004) discloses an inventoriable-object control and tracking system comprising, in accordance with its preferred embodiments, an object identification assembly having an electronic device, with a unique electronically-readable identification code, which is connected to an inventoriable-object to enable control over access to the object and tracking of the object to identify a user in possession of the object. The system further includes a row and column matrix of electrical connectors located offset from a panel defining a corresponding row and column matrix of polarized slots for receipt of a plurality of object identification assemblies in a single orientation. Each connector of a matrix of electrical connectors comprises a pair of opposed, spring contacts having independently-deflectable portions to insure proper electrical contact with an electronic device of each object identification assembly. The system also includes a local controller connected to the matrix of electrical connectors and to a remote controller which executes, in accordance with the preferred methods, a plurality of software routines that communicate bi-directionally using a serial protocol, via a parallel data communications interface, to acquire and process data from each object identification assembly present. In accordance with the preferred apparatus, the system additionally comprises a storage unit having a drawer which is withdrawable from an enclosure upon operation of an electronically-actuated locking mechanism. The storage unit includes a slot and electrical connector positioned in a drawer face plate assembly for receipt of a personal identification assembly which enables a user to gain access to the plurality of object identification assemblies residing in the storage unit. A drawer switch located in the enclosure enables the remote controller to determine whether or not the drawer is open and, if so, to additionally determine whether or not the drawer has been open for an inordinate amount of time. Thus, although this scheme uses a matrix to determine which devices to read, the devices are still read in series, limiting read-time efficiency.

Thus, what is still needed in the art is a circuit, system, and method for reading memory-based digital identification devices in parallel, such that cumulative read time may be significantly reduced.

BRIEF SUMMARY OF THE INVENTION

In various exemplary embodiments, the present invention provides an electronic detection, identification, and/or activation system that may be used to selectively enable a microcontroller or microprocessor to detect and identify, in order, a specific digital device among multiple digital devices. As described above, typical of such a digital device is an IButton® microprocessor, which belongs to a generic group of microprocessors that are typically disposed within a protective stainless steel can or the like. Each digital device has a unique digital registration number, and comprises an element of a module. The module also includes a microcontroller, a light-emitting source, and is connected to both a host controller (i.e. another microprocessor) and an electrical power source. The microcontroller and the digital device are in electrical communication with a serial data bus. The light-emitting source provides an identifying position signal for the digital device when activated. Typically, the light-emitting source is a light-emitting diode (LED) or the like, and it is flashed on-and-off, for example. The electrical power source may be auxiliary or, if adequate, drawn directly off the serial data bus. The overall system includes a plurality of modules.

According to one exemplary embodiment of the present invention, the electronic detection, identification, and/or activation system includes a touch-and-hold connector configured to hold an object of interest, a digital device coupled to the touch-and-hold connector, wherein the digital device has a unique digital registration number, a microcontroller that reads the unique digital registration number of the digital device, a storage receptacle configured to selectively receive the touch-and-hold connector, a light-emitting source coupled to the storage receptacle and associated with the touch-and-hold connector, and an electrical power source.

According to another exemplary embodiment of the present invention, electronic detection, identification, and/or activation system includes a microprocessor, or host controller, in electrical communication with each of the microcontrollers, and, optionally, a computer coupled to the microprocessor.

According to yet another exemplary embodiment of the present invention, the electronic detection, identification, and/or activation system includes the digital device disposed within a protective housing.

According to yet another exemplary embodiment of the present invention, the electronic detection, identification, and/or activation system includes a light-emitting diode (LED) associated with the touch-and-hold connector.

According to yet another exemplary embodiment of the present invention, the electronic detection, identification, and/or activation system includes the digital device in electrical communication with a serial data bus.

According to yet another exemplary embodiment of the present invention, the electronic detection, identification, and/or activation system includes a light-emitting source that provides an identifying position signal indicating when the touch-and-hold connector is the one receiving or not receiving a digital device or multiple digital devices of interest.

According to yet another exemplary embodiment of the present invention, the electronic detection, identification, and/or activation system further includes a microprocessor, or host controller, operable for selectively illuminating the light-emitting source.

According to yet another exemplary embodiment of the present invention, a reader board assembly system for identifying a digital device among multiple digital devices includes a plurality of touch-and-hold connectors each configured to hold an object of interest, an Ibutton® digital device selectively coupled to each touch-and-hold connector, wherein each digital device has a unique digital registration number, a plurality of microcontrollers each identifying a single Ibutton® among multiple digital devices, a plurality of storage receptacles each configured to selectively receive one of the touch-and-hold connectors, at least one light-emitting source, an electrical power source, and a host controller for sending commands to each of the microcontrollers.

According to yet another exemplary embodiment of the present invention, an electronic detection, identification, and/or activation method includes providing a touch-and-hold connector configured to hold an object of interest, selectively providing a digital device coupled to the touch-and-hold connector, wherein the digital device has a unique digital registration number, providing a storage receptacle configured to selectively receive the touch-and-hold connector, providing a light-emitting source coupled to the storage receptacle and associated with the touch-and-hold connector, providing an electrical power source, providing a reader board assembly circuit connected to a host controller, sending commands from the host controller to the reader board assembly circuit to reset, sending commands to the reader board assembly circuit to learn all of the registration numbers of the digital devices present, and sending commands from the host controller to a reader board assembly circuit to activate and deactivate the light-emitting source.

According to yet another exemplary embodiment of the present invention, the electronic detection, identification, and/or activation method includes sending a learn command to the reader board assembly circuit and the reader board assembly circuit utilizing a Carrier Detect Multiple Access with Bit Arbitration (CDMA-BA) protocol to "fight" for a spot on the serial data bus.

According to yet another exemplary embodiment of the present invention, the electronic detection, identification, and/or activation method includes transmitting a first bit of the registration number on the serial data bus.

According to yet another exemplary embodiment of the present invention, the electronic detection, identification, and/or activation method includes detecting which logic that the serial data bus is currently learning.

According to yet another exemplary embodiment of the present invention, the electronic detection, identification, and/or activation method includes ceasing the transmittal of the digital registration number of the reader board assembly circuit when the logic placed upon the serial data bus is different that the current logic of the serial bus.

According to yet another exemplary embodiment of the present invention, the electronic detection, identification, and/or activation method includes transmitting all bits in the digital registration number for completing an ordered list of registration numbers from the lowest number to the highest number contained in the host's memory.

According to yet another exemplary embodiment of the present invention, an apparatus for releasably securing a digital device to a touch-and-hold connector includes a digital device having a unique digital registration number with a first end and a second end, at least one prong located on the first end of the digital device, a touch-and-hold connector located within the lip for receiving the at least one prong of the digital device, wherein the prong of the digital device is received with the at least one opening within the lip, whereby the digital device is rotated into a position so that the prong is in a spaced apart relationship with the at least one opening forming a releasable secure arrangement between the digital device and the touch-and-hold connector.

According to yet another exemplary embodiment of the present invention, an apparatus for releasably securing a digital device to a touch-and-hold connector including at least two prongs, and the touch-and-hold connector has at least two openings for receiving the at least two prongs.

According to yet another exemplary embodiment of the present invention, an apparatus for releasably securing a digital device to a touch-and-hold connector includes the second end of the digital device includes a grip for allowing a user to rotate the digital device.

According to yet another exemplary embodiment of the present invention, an apparatus for releasably securing a digital device to a touch-and-hold connector includes at least one stopper located within the cavity of the touch-and-hold connector for preventing rotational movement of the digital device.

According to yet another exemplary embodiment of the present invention, an apparatus for releasably securing a digital device to a touch-and-hold connector wherein the digital device and touch-and-hold connector are utilized as part of a key control and management system.

According to yet another exemplary embodiment of the present invention, an apparatus for releasably securing a digital device to a touch-and-hold connector wherein the digital device is in electrical communication with a serial data bus.

According to yet another exemplary embodiment of the present invention, an apparatus for releasably securing a digital device to a touch-and-hold connector includes a digital device having a unique digital registration number with a first end and a second end, at least one prong located on the first end of the digital device, a touch-and-hold connector located within the lip for receiving the at least one prong of the digital device in a cavity formed within the touch-and-hold connector, at least one shelf positioned in the cavity of the touch-and-hold connector for securely holding the at least one prong of the digital device releasably secure, wherein the prong of the digital device is received within the at least one opening within the lip, whereby the digital device is rotated into a position upon the shelf, so that the prong is in an engaged arrangement between the shelf and the lip forming a releasably secure arrangement between the digital device and the touch-and-hold connector.

According to yet another exemplary embodiment of the present invention, an apparatus for releasably securing a digital device to a touch-and-hold connector includes a digital device having a unique digital registration number with a first end and a second end, at least one prong located on the first end of the digital device, a touch-and-hold connector having a top portion comprising a lip with at least two flanges extending therefrom forming a cavity within the touch-and-hold connector, at least one shelf positioned within the cavity of the touch-and-hold connector for securely holding the at least one prong of the digital device releasably secure, wherein the prong of the digital device is received within the cavity, whereby the digital device is rotated into a position upon the shelf, so that the prong is in an engaged arrangement between the shelf and the lip forming a releasably secure arrangement between the digital device and the touch-and-hold connector.

In various exemplary embodiments the present invention also provides a circuit, system, and method for reading memory-based digital identification devices in parallel, such that cumulative read time is significantly reduced.

In one exemplary embodiment, the present invention provides a system for simultaneously reading a plurality of readable memory-based digital identification devices, including: a host microcontroller; and a plurality of readable memory-based digital identification devices electrically coupled to the host microcontroller in a parallel configuration; wherein the host microcontroller is configured to assert a read prompt to each of the plurality of the plurality of readable memory-based digital identification devices during a same clock cycle; wherein each of the plurality of readable memory-based digital identification devices is configured to send a response to the host microcontroller in a same clock cycle; and wherein the host microcontroller is configured to capture identification data from each of the plurality of readable memory-based digital identification devices in a same clock cycle. The host microcontroller is further configured to read all corresponding bits from the plurality of readable memory-based digital identification devices in a given clock cycle before receiving additional bits for any of the plurality of readable memory-based digital identification devices. When a last bit is received from any of the plurality of readable memory-based digital identification devices, the last bit is also received from all others of the plurality of readable memory-based digital identification devices and an entire dataset is available to the host microcontroller for processing. Each of the plurality of readable memory-based digital identification devices includes an integrated circuit. Optionally, each of the plurality of readable memory-based digital identification devices includes a housing. Each of the plurality of readable memory-based digital identification devices is coupled to an asset to be identified.

In another exemplary embodiment, the present invention provides a method for simultaneously reading a plurality of readable memory-based digital identification devices, including: providing a host microcontroller; and providing a plurality of readable memory-based digital identification devices electrically coupled to the host microcontroller in a parallel configuration; wherein the host microcontroller is configured to assert a read prompt to each of the plurality of the plurality of readable memory-based digital identification devices during a same clock cycle; wherein each of the plurality of readable memory-based digital identification devices is configured to send a response to the host microcontroller in a same clock cycle; and wherein the host microcontroller is configured to capture identification data from each of the plurality of readable memory-based digital identification devices in a same clock cycle. The host microcontroller is further configured to read all corresponding bits from the plurality of readable memory-based digital identification devices in a given clock cycle before receiving additional bits for any of the plurality of readable memory-based digital identification devices. When a last bit is received from any of the plurality of readable memory-based digital identification devices, the last bit is also received from all others of the plurality of readable memory-based digital identification devices and an entire dataset is available to the host microcontroller for processing. Each of the plurality of readable memory-based digital identification devices includes an integrated circuit. Optionally, each of the plurality of readable memory-based digital identification devices includes a housing. Each of the plurality of readable memory-based digital identification devices is coupled to an asset to be identified.

BRIEF DESCRIPTION OF DRAWINGS

The present invention is illustrated and described herein with reference to various drawings, in which like reference numbers are used to denote like system components and/or method steps, as appropriate, and in which:

FIG. 3 is a top view of a touch-and-hold connector;

FIG. 4 is a top view of an exemplary embodiment of the touch-and-hold connector;

FIG. 5 is a cut-away side view of an exemplary embodiment of the touch-and-hold connector;

DETAILED DESCRIPTION OF THE INVENTION

Figure 1:
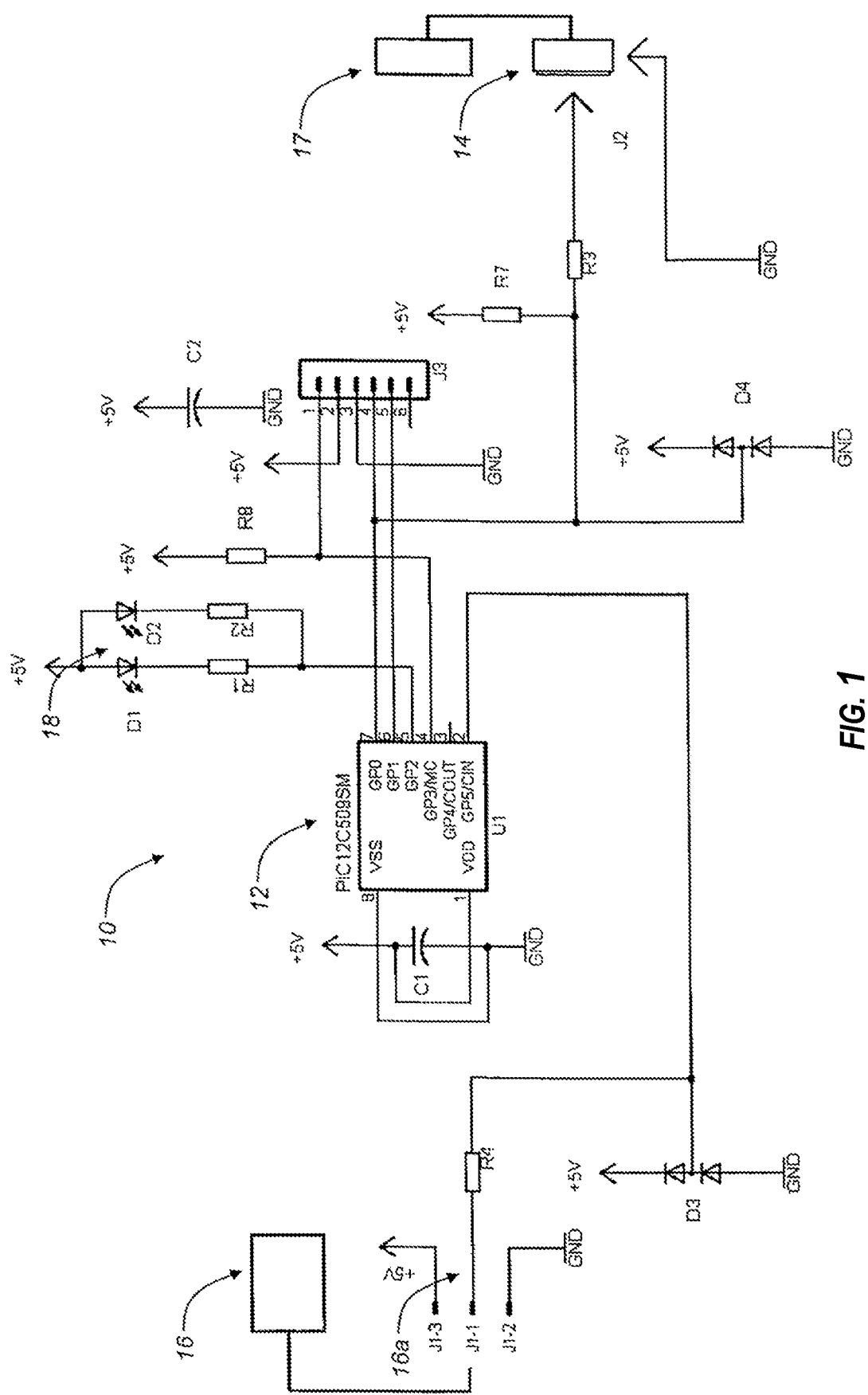
FIG. 1 is an electronic circuit diagram illustrating, in one exemplary embodiment of the present invention, how a module having a digital device detects, identifies, and/or activates that digital device using a microcontroller, a host controller, and a serial data bus.

Referring now specifically to the drawings, the reader board assembly (RBA) circuit 10 of the present invention is illustrated in FIG. 1. As illustrated, the RBA circuit 10 includes a microcontroller 12 or microprocessor, a touch-and-hold connector 14 or the like, a host controller 16, a host controller connector 16a, and a digital device 17 with a unique digital registration number. This digital device 17 is selectively coupled to the touch-and-hold connector 14 or the like, coupling the digital device 17 to the RBA circuit 10. It will be readily apparent to those of ordinary skill in the art that the digital device 17 may also be permanently or otherwise coupled to the RBA circuit 10. In general, the RBA circuit 10 enables asynchronous communications between the digital device 17, via the touch-and-hold connector 14 or the like, and the microcontroller 12. The information received and buffered by the microcontroller 12 is eventually communicated to the host controller 16 and, optionally, a personal computer (not illustrated) or the like. The RBA circuit 10 allows the host controller 16 to identify, locate, and/or activate a specific digital device 17 among multiple digital devices 17 via its unique digital registration number, or to detect the absence of a specific digital device 17 among multiple digital devices 17 via its unique digital registration number, as is described in greater detail herein below.

The RBA circuit 10 essentially forms one of a plurality of modules disposed on a board and within a case having a strikable door, for example, in the case of a key control and management system. A module is a serial data bus detection and identification circuit that enables the microcontroller 12 to detect, identify, and/or activate a specific digital device 17 associated with the module among multiple modules having multiple digital devices 17, all connected to the same serial data bus, for example. Furthermore, the RBA circuit 10 enables a user to easily identify and locate the specific digital device 17, as the location preferably has an associated light-emitting source 18, such as a light-emitting diode (LED) or the like, that is selectively activated by the host controller 16/RBA circuit 10 once the specific digital device 17 has been detected, identified, and/or activated.

In general, the digital device 17 may be an IButton® microprocessor (Dallas Semiconductor) or any other suitable digital device that has a unique digital registration number. The IButton® is a microprocessor that is enclosed in a 16 mm stainless steel can or the like. Because of this unique and durable stainless steel can, the IButton® may be mounted virtually anywhere because it is rugged enough to withstand harsh environments, indoors or outdoors. Thus, the digital device is durable enough to attach to a key fob, ring, or other personal item, and may be used daily for applications, such as access control for vehicles, buildings, computers, etc. The touch-and-hold 14 may be an IButton® receptacle or the like.

In one exemplary embodiment of the RBA circuit 10, as illustrated in FIG. 1, the microcontroller 12 utilizes a firmware-based implementation of the serial data bus protocol.

Each digital device 17 has a distinct and identifiable digital registration number, which essentially becomes the digital registration number of the associated microcontroller 12 once the learning process has taken place. Since each digital device 17 has a different digital registration number, a specific digital device 17 may be detected, identified, and/or activated among multiple digital devices 17. Likewise, the absence of a specific digital device 17 may be detected and identified. Only the digital registration number of a digital device 17 needs to be known to detect and identify the absence of a sought after digital device among a plurality of digital devices. This is accomplished via the use of the microcontroller 12 and host controller 16. The microcontroller 12 is able to read the digital registration number of any digital device 17 that is placed in the touch-and-hold connector 14 or the like. The microcontroller 12 utilizes the serial data bus protocols in its firmware to detect and identify the specific digital device 17. The digital registration number of the specific digital device 17 is used by the RBA circuit 10 to identify it on the serial data bus, such that it can be individually addressed by the host controller 16 from the plurality of modules located on the serial data bus.

The digital registration numbers of the RBA circuit 10 are learned through an algorithm utilizing a Carrier Detect Multiple Access with Bit Arbitration (CDMA/BA) protocol. The CDMA/BA protocol is utilized to find/learn the digital devices 17, and is designed to allow the RBA circuit 10 to detect whether or not a serial data bus collision has occurred. The CDMA/BA protocol is also designed to allow the RBA circuit 10 to detect if the RBA circuit's digital registration numbers were successfully transmitted.

In operation, the host controller 16 issues a serial data bus reset command to the serial data bus. A learn command is then issued by the host controller 16 to learn all of the RBA circuit's digital registration numbers on the serial bus for the digital devices 17 that are present. In response to this learn command, the modules with an IButton® microprocessor present begin to transmit the first bit of their 64-bit digital registration number on the serial data bus. The modules transmit data in binary 1's and 0's, wherein 1 is a recessive bit and 0 is a dominant bit. If the module begins to transmit its first bit by either placing a binary 1 on the serial data bus, but the RBA circuit 10 detects that the serial data bus is currently a binary 0, the module placing a binary 1 gives up transmitting its respective digital registration number altogether. The modules that placed a binary 1 will not transmit their respective digital registration numbers until the next learn command is issued by the host controller 16 on the serial data bus. The modules that placed a binary 0 will continue to transmit their respective digital registration numbers. This bit-by-bit transmission and arbitration detection continues for the remaining 63 bits until one and only one module with the lowest number has transmitted its complete digital registration number. When this occurs, the completed module flags itself to not participate in any serial data bus commands until the next serial data bus reset command is issued. The result of this learn algorithm is a complete ordered list of all digital registration numbers from the lowest number to the highest number contained in the memory of the host controller 16. Various other commands may also be issued by the host controller.

Once the ordered list of digital registration numbers has been compiled and stored in the memory of the host controller 16, the method of detecting and identifying a specific digital device 17 may begin. The host controller 16 sends a command to each module seeking the specific digital device 17 by the digital registration number. Because the list of digital registration numbers is stored in the memory of the host controller 16 from the lowest digital registration number to the highest digital registration number, this storage arrangement allows the host controller 16 to easily locate the digital registration number within its memory, and send a command to the specific module where the specific digital device 17 is located. Thereafter, the specific digital device 17 may be announced to the user via a flashing or non-flashing light-emitting source 18, such as an LED or the like. The host controller 16 sends a command to the RBA circuit 10 to turn the flashing or non-flashing light-emitting source 18 on and/or off. In addition, the light-emitting source 18 may be employed to indicate the removal of a digital device 17 from the serial data bus.

A data line may be permanently connected to the data side of the digital device connector. The microcontroller 12 is connected to the serial data bus by the RBA circuit 10. The RBA circuit 10 allows for the digital device 17 to be switched in and out of the RBA circuit 10. The ability to switch in a specific digital device 17 requires the host controller 16 to identify the specific digital device 17, as they are able to be removed from and inserted into the RBA circuit 10. The host controller 16 sends specific commands to each module that illuminates the light-emitting source 18. This identifies the identity/location of the specific digital device 17 to the user. The unique digital registration number of the module may be stored in the memory of the host controller 16, and later used to sequentially read in the digital device's unique digital registration number. It should be noted that multiple digital devices 17 may be connected to a one-wire bus and identified by each digital device's unique digital registration number. In addition, the learning process may be periodic (i.e. polling-based) or event-driven.

In an alternative embodiment of the present invention, the RBA circuit 10 may be changed such that the light-emitting source 18 is connected to the serial data bus, as opposed to the VCC connection. This change enables the whole circuit to operate without external power, if the power requirements are met by the serial data bus. Modules may be added directly to the serial data bus, essentially like a plug-and-play component on a personal computer (PC).

As described above, U.S. Pat. No. 6,693,538 discloses one specific application of a digital device. Object carriers are provided for use with an object tracking and control system of a type having a storage receptacle with a tray provided with an array of slots for receiving identification (ID) tags bearing touch memory devices. A computer-based controller is provided for detecting the absence or presence and identity of ID tags disposed in the slots. The carrier includes a container with an openable panel for placing objects in and removing objects from the carrier. A thin plastic tongue projects from the carrier and bears a touch memory device. Carriers bearing objects to be tracked are placed in the storage receptacle with their tongues extending into the slots of the receptacle. The controller can thus detect and log the removal and replacement of the carrier in the storage receptacle. In one embodiment, the opening and closing of the carrier when it is not stored in the receptacle is detected and logged for tracking access to the carrier in more detail. In general, each of the carriers includes an internal-addressable switch having one or more input/output (I/O) ports; an on-board sensor, such as a loop-detector sensor for detecting when an object is removed from the carrier; a reed switch for detecting the opening of the carrier, or another type of sensor depending on the intended use of the system; and an LED attached to the carrier.

The present invention, however, provides a system that is simpler, omitting the internal-addressable switch and the one or more I/O ports, and associating the LEDs with the storage receptacle, as opposed to the carriers. Various data and ground connections are also provided. In effect, the RBA circuit 10 provides a touch-and-hold connector 14 or the like, suitable for engaging a digital device 17 or the like, that has a unique digital registration number. The touch-and-hold connector 14 or the like may be selectively identified, located, and/or activated, preferably in conjunction with the lighting, intermittently or otherwise, providing the location of the plug-in carrier or holder to a user. As described above, the LED or the like is assembled as part of the storage receptacle, as opposed to the plug-in carrier or holder.

Figure 2:
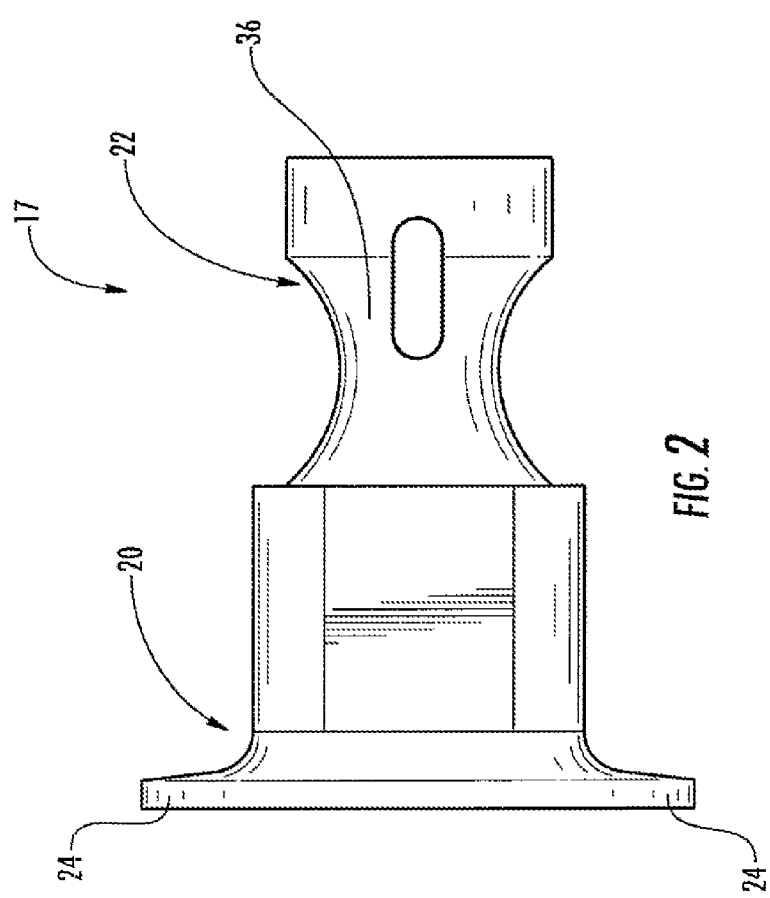
FIG. 2 is a perspective view of a digital device.

The digital device 17 (or, more accurately, a holding structure including and incorporating the digital device), as illustrated in FIG. 2, includes a first end 20 and a second end 22. The first end 20 of the digital device 17 includes at least one prong 24. Preferably, the digital device 17 includes two prongs 24 located on opposite sides of the first end 20 concentrically about a central axis of the digital device 17. As illustrated in FIG. 3, the touch-and-hold connector 14 includes a lip 26 around the periphery, forming a cavity 28 therein. The lip 26 of the touch-and-hold connector 14 includes at least one opening 30 for receiving the at least one prong 24 of the digital device 17. Preferably, the lip 26 includes two openings 30 for receiving the two prongs 24 of the digital device 17. The openings 30 are in a correspondingly similar arrangement to the position of the prongs 24.

In operation, the digital device 17 is aligned with the prong 24 over the opening 30 in the lip 26. The digital device 17 is inserted within the body of the touch-and-hold connector 14, wherein the prong 24 is received within the opening 30 of the lip 26. The digital device 17 is then rotated, whereby the prong 24 is moved away from the opening 30 and is located beneath the lip 26. The digital device 17 may be rotated until the prongs 24 are beneath and in alignment with the opening 30 in the lip 26, thus allowing the digital device 17 to be removed from the touch-and-hold connector 14. As illustrated in FIG. 3, a plurality of stoppers are located within the cavity of the touch-and-hold connector 14, and beneath the lip 26. The stoppers 32 prevent the prongs 24 of the digital device 17 from rotating past a predetermined location. In addition, the stoppers 32 may prevent the prongs 24 from rotating in a predetermined direction. For example, as illustrated in the exemplary embodiment of FIG. 2, two stoppers 32 are located adjacent to the two openings 30, thus preventing rotational movement in the counterclockwise direction. In addition, two stoppers 32 are located between the two openings 30, thus preventing movement past this predetermined point, while the prongs 24 are rotated in the clockwise direction. Alternatively, a shelf 34 may be positioned on the floor of the cavity, and beneath the lip 26. The purpose of the shelf 34 is to engage the prongs 24 of the digital device 17 for forming a secure arrangement between the prongs 24 and the bottom portion of the lip 26. This arrangement is illustrated in FIG. 4.

In another exemplary embodiment of the present invention, the digital device 17 includes a grip 36 located in close proximity to the second end of the digital device 17. The grip 36 enables a user to securely retain the digital device 17 when inserting the device into and out of the touch-and-hold connector 14. This is illustrated in FIG. 2.

In yet another exemplary embodiment of the present invention, as illustrated in FIG. 5, the touch-and-hold connector 14 employs the use of at least two flanges 38. The flanges 38 are positioned on an outer lip 26 of the touch-and-hold connector, which extends over the cavity within the touch-and-hold connector 14. Below the at least two flanges 38, a shelf 34 is located on the floor of the cavity. The purpose of the shelf 34 is to engage the prongs 24 of the digital device 17 for forming a secure arrangement between the prongs 24 and the flanges 38. In addition thereto, a stopper may be located on one side of the flange, thus preventing the prong 24 from advancing past the flanges 38.

Figure 6:
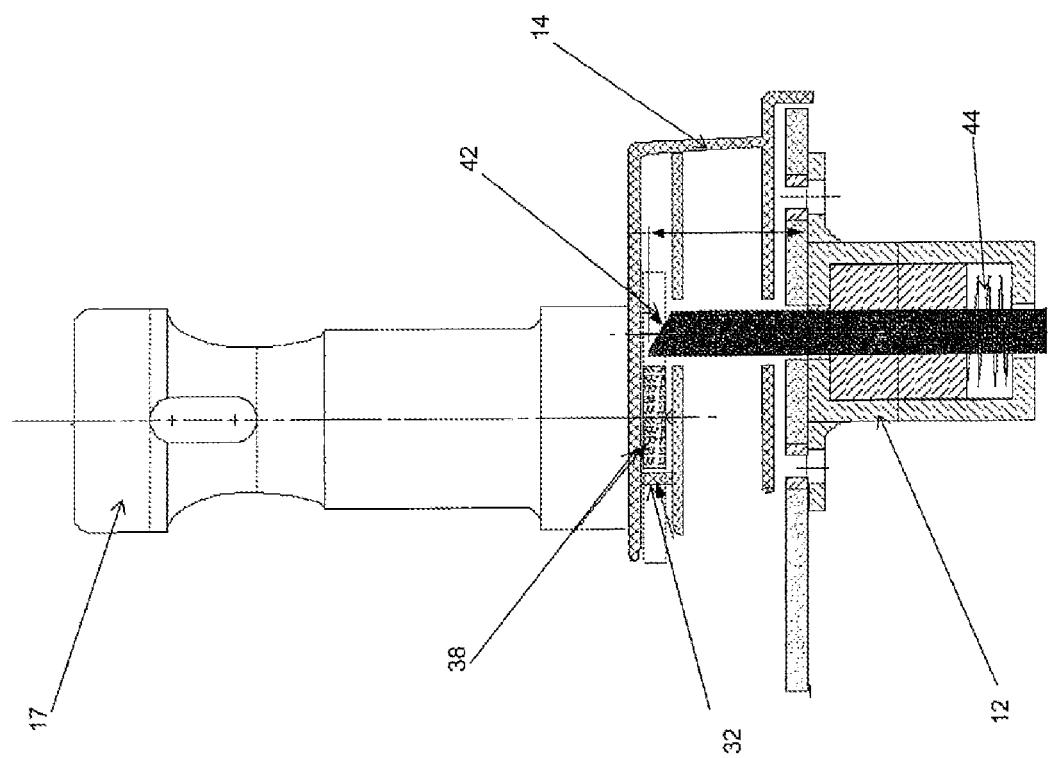
FIG. 6 is a cut-away side view of an exemplary embodiment of the touch-and-hold connector.

In yet another exemplary embodiment of the present invention, as illustrated in FIG. 6, the touch and hold connector 14 includes a solenoid 40 attached thereto. Preferably, the solenoid 40 is attached to the underside of the touch and hold connector 14, and opposite the digital device 17. The solenoid 40 includes a pin 42 that translates in the vertical direction, and translates within a channel located within the touch and hold connector 14.

The pin 42 is biased in the upward direction for securing the digital device 17 in place. In other words, the pin 42 prevents the flanges 38 from rotating, thus securely holding the digital device 17 within the touch and hold connector 14. The pin 42 prevents the digital device 17 from being removed from the touch and hold connector 14, unless the pin 42 is recessed within the channel of the touch and hold connector 14. The solenoid 40 is activated by the RBA circuit 10 when the digital device 17 is located. Once the specific digital device 17 is located, the solenoid 40 is activated, thus moving the pin 42 into a recessed position within the channel. When the pin 42 is in the recessed position, the flanges 38 are allowed to rotate, allowing the digital device 17 to be removed from the touch and hold connector 14.

In the exemplary embodiment illustrated in FIG. 6, the pin 42 is held in place by a biasing member 44 that biases the pin 42 in a position whereby the pin 42 is fully extended through the channel in the touch and hold connector 14, thus preventing movement of the flanges 38. When the solenoid 40 is activated, the pin 42 is translated into a recessed position allowing the flanges 38 to rotate. After the digital device 17 is removed from the touch and hold connector 14, the pin is again fully extended through the channel in the touch and hold connector 14. The pin 42 also includes an inclined top portion that allows the digital device 17 to be positioned in the touch and hold connector 14 with ease. Upon insertion, the flange 38 contacts the inclined portion, thus depressing the pin 42 into a recessed position, allowing the flange 38 of the digital device 10 to clear the pin 42 prior to contacting the stopper 32. Thereafter, the pin 42 is biased in the upwards direction, preventing rotational movement of the flanges 38 until the solenoid is activated.

Figure 7:
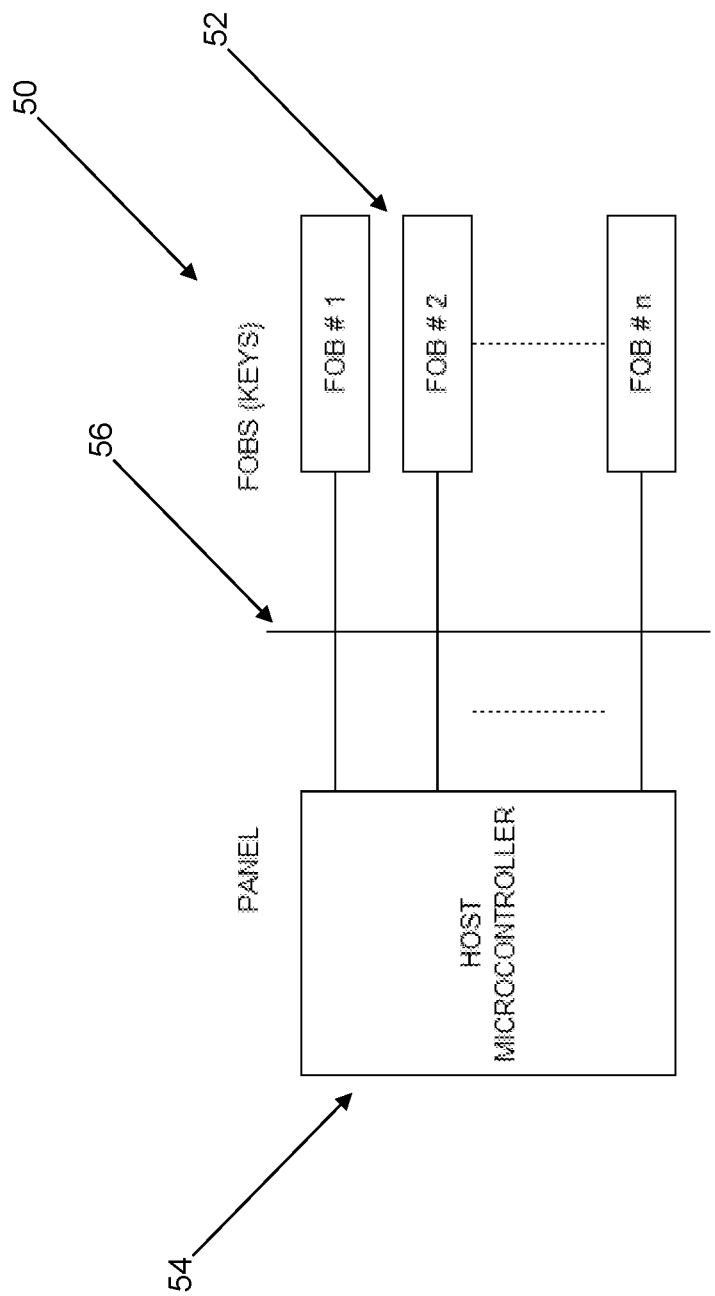
FIG. 7 is a schematic view of one exemplary embodiment of the parallel-read system and method of the present invention, highlighting multiple key fobs coupled to a host microcontroller.

Referring now specifically to FIG. 7, in another exemplary embodiment, the parallel circuit, system, and method 50 of the present invention includes a plurality of readable memory-based digital devices 52 that are selectively coupled to a host microcontroller 54 disposed in a panel 56 or the like. For example, each of the readable memory-based digital devices 52 includes an integrated circuit (IC) disposed in a fob housing or the like or forming a fob body or the like configured to be selectively attached to a key or other asset, such that the key or other asset fobs may be selectively assembled in an array on the panel 56 and selectively detected/identified. Each IC is a non-volatile memory consisting of a unique serial number and, optionally, containing other information. When present on the panel 56, each IC is read by the host microcontroller 54. As described herein above, all conventional methodologies involve performing such reading operation is series, which is time consuming.

Figure 8:
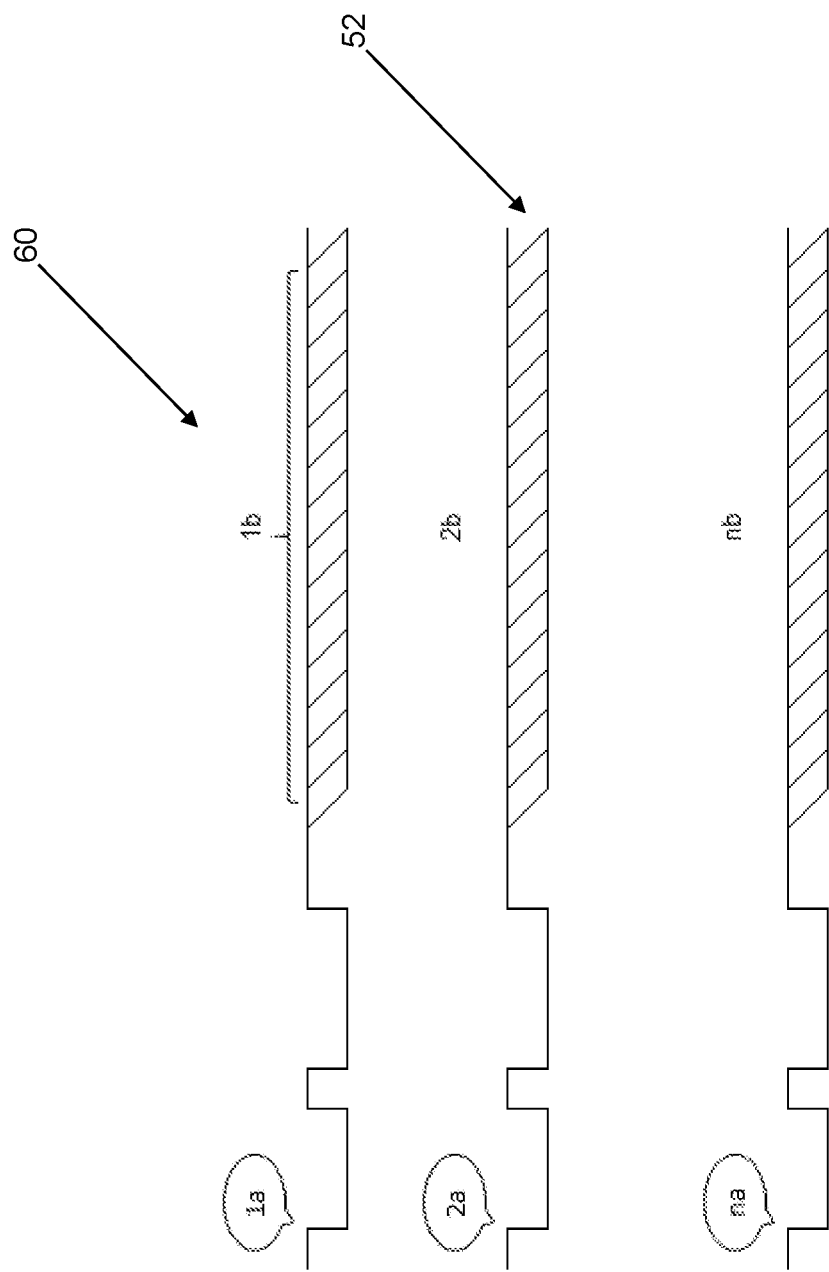
FIG. 8 is another schematic view of one exemplary embodiment of the parallel-read system and method of the present invention, highlighting data interaction between the multiple key fobs coupled to the host microcontroller.

Referring now specifically to FIG. 8, the parallel circuit, system, and method 50 (FIG. 7) of the present invention reads all of the ICs simultaneously in parallel. Specifically, the communication algorithm 60 of the present invention involves the host microcontroller 54 (FIG. 7) asserting a read prompt to all readable devices 52 in the same clock cycle (prompts 1a, 2a, ..., na). This results in all readable devices 52 responding to the host microcontroller 54 at the same time (responses 1b, 2b, ..., nb). Accordingly, the data from all readable devices 52 is captured by the host microcontroller 54 in the same clock cycle using a parallel port read. All bits read in a given clock cycle are read before the next bit comes in. As soon as the last bit is received from the first readable device 52, which implies that the last bit is also received from the other readable devices 52, the entire dataset is available to the host microcontroller 54 for processing. Because this reading operation is now performed in parallel, the process is expedited. For example, the parallel circuit, system, and method 50 may read 8, 16, 32, or more ICs simultaneously, depending on the architecture of the host microcontroller. This provides marked advantages over conventional non-matrixed and matrixed serial schemes, which read only 1 IC at a time.

Although the present invention has been illustrated and described herein with reference to exemplary embodiments and specific examples thereof, it will be readily apparent to those of ordinary skill in the art that other exemplary embodiments and specific examples may perform similar functions and/or achieve like results. All such equivalent embodiments and examples are within the spirit and scope of the present invention, are contemplated thereby, and are intended to be covered by the following claims.

What is claimed is:

1. A system for simultaneously reading a plurality of readable memory-based digital identification devices, comprising:
   a host microcontroller; and
   a plurality of readable memory-based digital identification devices electrically coupled to the host microcontroller in a parallel configuration;
   wherein the host microcontroller is configured to assert a read prompt to each of the plurality of the plurality of readable memory-based digital identification devices during a same clock cycle;
   wherein each of the plurality of readable memory-based digital identification devices is configured to send a response to the host microcontroller simultaneously in a same clock cycle; and
   wherein the host microcontroller is configured to capture corresponding bits of identification data from each of the plurality of readable memory-based digital identification devices simultaneously in a same clock cycle via a parallel port read, such that all bits received from the plurality of readable memory-based digital identification devices in a given clock cycle are read before a next bit is received by the host microcontroller.

2. The system of claim 1, wherein the host microcontroller is further configured to read the corresponding bits from all of the plurality of readable memory-based digital identification devices in a given clock cycle before receiving additional bits for any of the plurality of readable memory-based digital identification devices.

3. The system of claim 1, wherein, as soon as a last bit is received from any of the plurality of readable memory-based digital identification devices, the last bit is assumed to also have been received from all others of the plurality of readable memory-based digital identification devices, an entire dataset is available to the host microcontroller for processing.

4. The system of claim 1, wherein each of the plurality of readable memory-based digital identification devices comprises an integrated circuit.

5. The system of claim 1, wherein each of the plurality of readable memory-based digital identification devices comprises a housing.

6. The system of claim 1, wherein each of the plurality of readable memory-based digital identification devices is coupled to an asset to be identified.

7. A method for simultaneously reading a plurality of readable memory-based digital identification devices, comprising:
providing a host microcontroller; and
providing a plurality of readable memory-based digital identification devices electrically coupled to the host microcontroller in a parallel configuration;
wherein the host microcontroller is configured to assert a read prompt to each of the plurality of the plurality of readable memory-based digital identification devices during a same clock cycle;
wherein each of the plurality of readable memory-based digital identification devices is configured to send a response to the host microcontroller simultaneously in a same clock cycle; and
wherein the host microcontroller is configured to capture corresponding bits of identification data from each of the plurality of readable memory-based digital identification devices simultaneously in a same clock cycle via a parallel port read, such that all bits received from the plurality of readable memory-based digital identification devices in a given clock cycle are read before a next bit is received by the host microcontroller.

8. The method of claim 7, wherein the host microcontroller is further configured to read the corresponding bits from all of the plurality of readable memory-based digital identification devices in a given clock cycle before receiving additional bits for any of the plurality of readable memory-based digital identification devices.

9. The method of claim 7, wherein, as soon as a last bit is received from any of the plurality of readable memory-based digital identification devices, the last bit is assumed to also have been received from all others of the plurality of readable memory-based digital identification devices, an entire dataset is available to the host microcontroller for processing.

10. The method of claim 7, wherein each of the plurality of readable memory-based digital identification devices comprises an integrated circuit.

11. The method of claim 7, wherein each of the plurality of readable memory-based digital identification devices comprises a housing.

12. The method of claim 7, wherein each of the plurality of readable memory-based digital identification devices is coupled to an asset to be identified.

* * * * *